United States Patent [19]

Nakayama et al.

[11] Patent Number: 4,816,341
[45] Date of Patent: Mar. 28, 1989

[54] MAGNETIC RECORDING MEDIUM

[75] Inventors: Masatoshi Nakayama; Haruyuki Morita; Yuichi Kubota; Keiko Tsuchiya, all of Tokyo, Japan

[73] Assignee: TDK Corporation, Tokyo, Japan

[21] Appl. No.: 812,859

[22] Filed: Dec. 23, 1985

[30] Foreign Application Priority Data

Dec. 29, 1984 [JP] Japan ............................... 59-278811
Dec. 30, 1984 [JP] Japan ............................... 59-281045

[51] Int. Cl.$^4$ ............................................. G11B 5/70
[52] U.S. Cl. ..................................... 428/458; 427/40; 427/129; 427/131; 427/132; 427/128; 428/480; 428/694; 428/695; 428/900
[58] Field of Search ................. 427/41, 129, 128, 131, 427/132; 428/480, 695, 694, 900, 458; 360/134–136

[56] References Cited

U.S. PATENT DOCUMENTS 4,250,225  2/1981  Shirahata ........................... 427/129
4,526,806  7/1985  Haque ................................ 427/38
4,543,268  9/1985  Sidney ............................... 427/35
4,548,864 10/1985  Nakayama ......................... 428/693
4,575,475  3/1986  Nakayama ......................... 428/900
4,582,746  4/1986  Shirahata .......................... 428/900
4,594,262  6/1986  Kreil .................................. 427/35
4,599,266  7/1986  Nakayama ......................... 428/900

Primary Examiner—Ellis P. Robinson
Attorney, Agent, or Firm—Oblon, Fisher, Spivak, McClelland & Maier

[57] ABSTRACT

In a magnetic recording medium comprising a base film and a magnetic layer formed on the base film, the base film has been plasma treated in an atmosphere consisting essentially of an inorganic gas containing N, H, and optionally O at frequencies in the range of 10 to 200 kHz. A perpendicular magnetizable metal thin film layer can be deposited on the plasma-treated surface of a resin substrate having a heat distortion temperature of at least 150° C. without disturbance on the crystal structure of the layer.

11 Claims, 1 Drawing Sheet

MAGNETIC RECORDING MEDIUM

BACKGROUND OF THE INVENTION

This invention relates to magnetic recoding media, and more particularly, to magnetic recording media having a base film plasma treated for improved durability.

Several decades have passed since the appearance of megnetic recording media comprising a nonmagnetic substrate and a magnetic layer formed from a magnetic powder of oxide type such as gamma-$Fe_2O_3$ and cobalt-containing gamma-$Fe_3O_4$ and a binder. Recently, for the purpose of further improving recording density, magnetic recording media comprising a magnetic layer formed from a ferromagnetic powder such as Fe, Co, Ni, Fe-Co, Co-Ni, Fe-Co-Ni, Fe-Co-B, Fe-Co-Cr-B, Mn-Bi, Mn-Al, Fe-Co-V, etc. and a binder, and magnetic recording media having a magnetic layer in the form of a vacuum deposited metal film or sputtered metal film were developed and are now of great interest in the art.

These magnetic recording media, particularly for use as magnetic tape and magnetic disc, must fulfill a number of requirements including low dynamic coefficient of friction, smooth and stable travel performance for a prolonged period, improved wear resistance, stability under storage environment to ensure consistent reproduction, and durability (durability of tape both during normal operation and in the still mode).

A variety of pre-treatments have heretofore been made on various base films for the purpose of improving durability. Such pre-treatments include treatments with chemical solution, coating, corona discharge treatment, and the like.

Chemical treatments may be treatments with acid and alkali. Among such chemical treatments most effective is by oxidizing the surface of a base film with a chemical solution of a strong acid and/or a strong oxidizing agent, for example, chromate solution, and introducing carbonyl or carboxyl radicals to etch the surface. The chemical treatments, however, require subsequent rinsing and drying of film surface and a great investment is needed for the treatment of spent liquid. Particularly, chromate treatment yields a spent liquid which must be carefully treated for environmental pollution control, and its commercial utilization is now diminising.

The film coating technique is by coating a base film with an undercoat on which a magnetic layer is formed. The interaction between a binder in the undercoat and the magnetic layer is necessary. The composition of the undercoat must be selected to meet a particular binder and pigment used in the magnetic layer. The coating techniques require not only such a careful choice, but also coating and drying steps. Of course, the consumption of coating material increases the cost of products.

The corona discharge treatment is advantageous because of dry nature eliminating the need for additional steps of rinsing, drying, and disposal of spent liquid. Corona treatment has been carried out for many years and is effective in improving adhesion, wettability, and printability. The corona treatment, however, is not successful in improving the properties of magnetic recording media to such an extent as to fulfill the high performance which is imposed on the present day and future magnetic recording media.

Another technique known in the art is a flame treatment which is difficult to apply to magnetic recording media which require a high degree of dimensional stability.

Under these circumstances, a proposal is made to treat base films with a plasma. The plasma treatment is a one-step dry process and thus has the advantage that drying and disposal of spent solution are unnecessary and no extra material like binder is consumed. In addition, the plasma treatment enables high speed, continuous production so that it can be readily incorporated in the process of manufacturing magnetic recording media without sacrificing production speed and yield.

One technique for plasma treatment of base film is disclosed in Japanese Patent Publication No. 57-42889 (published on Sept. 11, 1982) wherein a treatment is effected with a plasma having a frequency in the range of radio frequency to microwave using a treating gas of air, oxygen, nitrogen, hydrogen, helium, argon, etc. The radio frequency of 13.56 MHz is only described in this publication.

Also, Japanese Patent Application Kokai No. 58-77030 (laid open on May 10, 1983) discloses a process of plasma treatment by applying an AC current at the commercial frequency between electrodes using a treating gas of oxygen, argon, helium, neon or nitrogen. These plasma treatments are somewhat successful in improving the adhesion of a treated base film to a magnetic layer and hence, the durability of magnetic recording media, but not fully satisfactory in bond strength and durability.

When it is intended to provide a magnetic thin film layer for perpendicular magnetization recording by applying a magnetic metal such as iron, cobalt, nickel and chromium or an alloy of such metals onto a substrate by vaccum deposition, sputtering or similar techniques, the substrate must be kept at an elevated temperature. Since substrates of conventional polyester resins, however, have a relatively low heat-resistant temperature and are liable to heat distortion during film formation, they should not be heated at an elevated temperature.

Thus, heat distortion during film formation may be avoided by the use of heat-resistant resins such as polyamides and polyimides as substrates for supporting perpendicular magnetization films. Unfortunately, most heat-resistant resins contain water therein. During film formation at elevated temperatures, the water content in the resin can be released to disturb the crystal structure of the magnetic layer being formed, detracting from perpendicular magnetization properties.

SUMMARY OF THE INVENTION

It is an object of the present invention to provide a novel and improved magnetic recording medium comprising a plasma treated base film and a magnetic layer and exhibiting the increased bond strength of magnetic layer to base film and hence, increased durability.

Another object of the present invention is to provide a new and improved magnetic recording medium comprising a plasma treated substrate whereby a magnetic thin film layer can be formed on the substrate without significantly disturbing the crystal struture thereof.

According to a first aspect of the present invention, there is provided a magnetic recording medium comprising a base film which has been plasma treated in an atmosphere consisting essentially of an inorganic gas containing N and H, and a magnetic layer formed on said base film. In one preferred embodiment, the inorganic gas contains oxygen (O) in addition to N and H.

According to a second aspect of the present invention, there is provided a magnetic recording medium comprising a substrate formed of a resin having a heat distortion temperature of at least 150° C. which has been plasma treated in an atmosphere consisting essentially of an inorganic gas, and a magnetic layer formed on said substrate.

BRIEF DESCRIPTION OF THE DRAWING

The above and other objects, features, and advantages of the present invention will be more readily understood by reading the following description taken in conjunction with the accompanying drawing, in which.

DETAILED DESCRIPTION OF THE INVENTION

Figure 1:
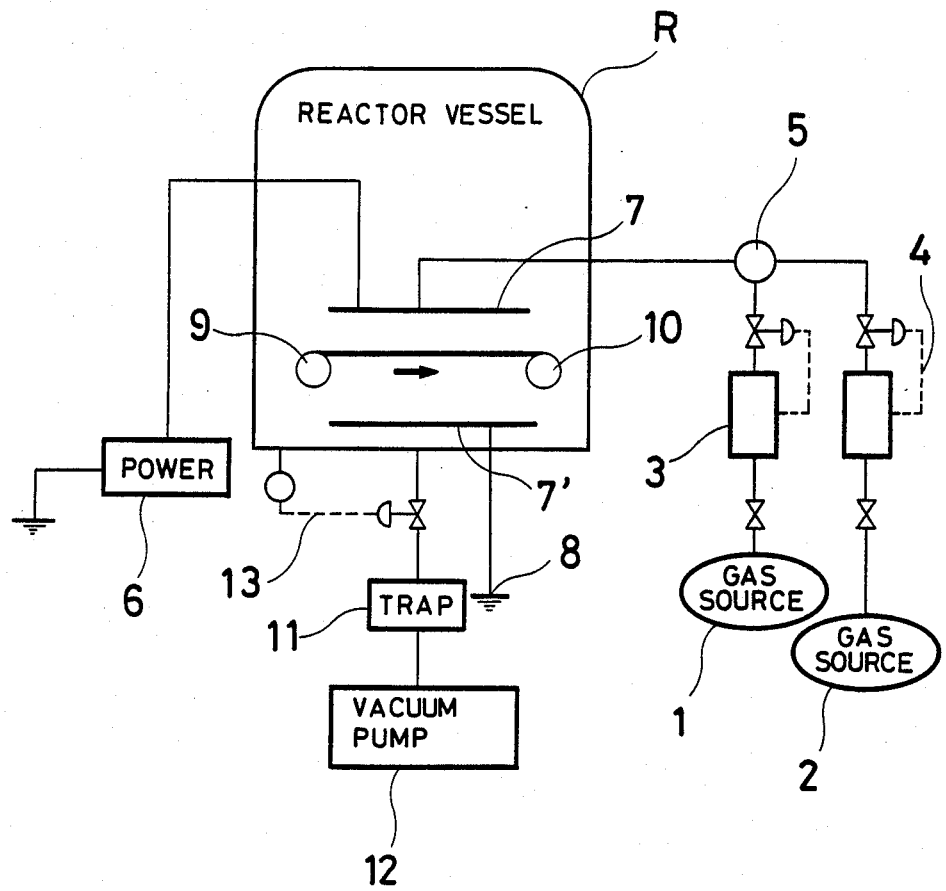
FIG. 1 is a schematic illustration of a plasma treating apparatus having a variable frequency power source.

The base films used in the first aspect of the present invention may be of any desired plastic material as long as it is non-magnetic. Generally used are polyesters such as polyethylene terephthalate. Further, the shape, size, and thickness of base films are not particularly limited as long as they meet the intended application.

In the first aspect of the present invention, base films are plasma treated on at least one surface which is to bear a magnetic layer. The plasma treatment is effected by feeding an inorganic gas as the treating gas, ionizing it, and contacting the gas-discharge plasma with the base film, thereby plasma treating the base film surface.

The principle of plasma treatment will be briefly described. When an electric field is applied to a gas kept at a reduced pressure, free electrons which are present in a minor proportion in the gas and have a remarkably greater inter-molecular distance than under atmospheric pressure are accelerated under the electric field to gain a kinetic energy (electron temperature) of 5 to 10 eV. These accelerated electrons collide against atoms and molecules to fracture their atomic and molecular orbitals to thereby dissociate them into normally unstable chemical species such as electrons, ions, neutral radicals, etc. The dissociated electrons are again accelerated under the electric field to dissociate further atoms and molecules. This chain reaction causes the gas to be instantaneously converted into highly ionized state. This is generally called a plasma. Since gaseous molecules have a less chance of collision with electrons and absorb little energy, they are kept at a temperature approximate to room temperature. Such a system in which the kinetic energy (electron temperature) of electrons and the thermal motion (gas temperature) of molcules are not correlated is designated a low temperature plasma. In this system, chemical species set up the state capable of additive chemical reaction such as polymerization while being kept relatively unchanged from the original. Base films are plasma treated under these conditions according to the present invention. The use of a low temperature plasma avoids any thermal influence on base films.

FIG. 1 illustrates a typical apparatus in which a base film on its surface is treated with a plasma. This plasma apparatus uses a variable frequency power source. The apparatus comprises a reactor vessel R into which a treating gas or gases are introduced from a source 1 and/or 2 through a mass flow controller 3 and/or 4. When desired, different gases from the sources 1 and 2 may be mixed in a mixer 5 to introduce a gas mixture into the reactor vessel. The treating gases each may be fed at a flow rate of 1 to 250 ml per minute.

Disposed in the reactor vessel R is means for supporting a base film to be treated, in this embodiment, a set of supply and take-up rolls 9 and 10 on which a base film for magnetic tape is wound. Depending on the particular shape of the magnetic recording medium base film to be treated, any desired supporting means may be used, for example, a rotary support apparatus on which the base film rests.

On the opposite sides of the base film to be treated are located a pair of opposed electrodes 7 and 7'. One electrode 7 is connected to a variable frequency power source 6 and the other electrode 7' grounded at 8.

The reactor vessel R is further connected to a vacuum system for evacuating vessel, including a liquefied nitrogen trap 11, a vacuum pump 12, and a vacuum controller 13. The vacuum system has the capacity of evacuating and keeping the reactor vessel R at a vacuum of 0.01 to 10 Torr.

In operation, the reactor vessel R is first evacuated by means of the vacuum pump 12 to a vacuum of $10^{-3}$ Torr or lower before a treating gas or gases are fed into the vessel at a given flow rate. Then the interior of the reactor vessel is maintained at a vacuum of 0.01 to 10 Torr. A take-up roll motor (not shown) is turend on to transfer the base film to be treated. When the flow rate of the treating gas mixture and the rate of transfer of the base film become constant, the variable frequency power source 6 is turned on to generate a plasma with which the ravelling base film is treated.

In this plasma treatment, the power source must have a frequency in the range of 10 to 200 kilohertz. Frequencies lower than 10 kHz and higher than 200 kHz result in a drastic reduction in bond strength, and hence, durability imparted to magnetic recording media. It is to be noted that other parameters including supply current and treating time may be as usual or property selected without undue experimentation.

According to the first aspect of the present invention, the treating atmosphere used in the plasma treatment is an inorganic gas containing nitrogen (N) and hydrogen (H) or an inorganic gas containing nitrogen (N), hydrogen (H), and oxygen (O).

The inorganic gas may be suitably selected from $N_2$, $H_2$, $NH_3$, $O_2$, $O_3$, $H_2O$, and $NO_X$ including NO, $N_2O$, and $NO_2$, and mixtures thereof. When the inorganic gas contains N, H, and optionally O, it preferably has an N content of 5 to 80 at%, an H content of 5 to 80 at%, and an O content of 0 to 50 at%. Outside this range the present invention is less effective.

In addition to the N—, H— and O-bearing gases mentioned above, the inorganic gas used may contain another gas which is selected from Ar, Ne, He and other rare gases and mixtures of two or more.

The thus plasma-treated base film exhibits a substantially reduced contact angle and it is observed by FTIR (Fourier transform infrared absorption spectrum) that the surface has been modified and N—H linkages are formed.

On the thus plasma-treated surface of a base film, a variety of magnetic layer may be formed. For example, the magnetic layers may be formed by depositing magnetic metals such as iron, cobalt and nickel or alloys thereof by vacuum deposition, ion plating, sputtering, electroplating and other metallizing techniques. The magnetic layers may also be formed by coating base films with magnetic compounds comprising magnetic powder, binder, organic solvents and other necessary ingredients followed by drying. In this case, the magnetic powder may be selected from gamma-Fe$_2$O$_3$, gamma-Fe$_3$O$_4$, Co-containing gamma-Fe$_2$O$_3$, Co-containing Fe$_3$O$_4$, Fe, and the like. The magnetic powder, binder and other ingredients are well known in the art.

The magnetic layer may be formed on the plasma treated surface of a base film directly or via an undercoat which may be formed by depositing an alloy of aluminum, copper, titanium, chromium or the like by ion plating, vacuum deposition, sputtering and other metallizing techniques. Instead, a resin optionally containing fine particles may be applied to the plasma-treated surface of a base film to form an undercoat.

The magnetic recording medium of the present invention may find a variety of uses.

In the first embodiment wherein a gas or gases containing N and H are used in the treating atmosphere and in the second embodiment wherein a gas or gases containing N, H and O are used in the treating atmosphere, the durability of the magnetic recording medium is critically improved particularly when the plasma frequency used falls within the specific range of 10 to 200 kHz. In particular, still life is significantly extended and runnability is significantly improved. The bond strength between the base film and the magnetic layer is significantly increased irrespective of whether or not an undercoat layer is interposed therebetween.

According to the second aspect of the present invention, a magnetic layer is formed on a substrate of a resin having a heat distortion temperatue of at least 150° C. which has been plasma treated in an atmosphere consisting essentially of an inorganic gas, with or without an intervening undercoat layer.

The substrate is formed of a heat resistant resin having a heat distortion temperature of 150° C. or higher. The use of such a heat resistant resin makes it possible to form a magnetic layer by a physical or chemical deposition technique without disturbing its crystal structure.

The heat resistant resin is selected from the group consisting of polyamides such as aromatic polyamides, polyimides such as aromatic polyimides, polyphenylene sulfides, polysulfones, all aromatic polyesters, polyether ether ketones (PEEK), polyether sulfones and polyetherimides, and mixtures thereof.

The polyamide designates a class of polymers having an amide bond —CONH—. They are classified into natural polyamides and synthetic polyamides. Typical of the natural polyamides are natural polypeptides. The synthetic polyamides are generally further classified into those polyamides of —(CORCONHR'NH)— type resulting from polycondensation of diamines and dicarboxylic acids and those polyamides of —(RCONH)— type resulting from lactam ring-opening polymerization or polycondensation of aminocarboxylic acids. Exemplary of the aromatic polyamides there may be given those polyamides described in Japanese Patent Publication Nos. 56-136826 and 59-45124. One example has the formula:

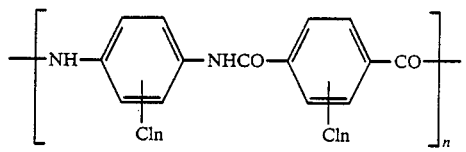

The polyimide designates a class of polymers having an imide bond in their backbone. They are generally prepared by reacting a dicarboxylic acid with a diamine to form a polyamic acid, shaping the polyamic acid, heating, drying and effecting cyclization. Typically, they are represented by the general formula:

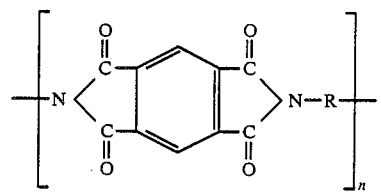

wherein R is a divalent group. These polyamides and polyimides are characterized by outstanding heat resistance.

The polyphenylene sulfides are polymers having the structure:

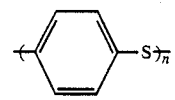

and excellent heat resistance.

The polysulfones are polymers having a sulfonyl bond

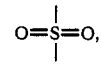

and among them, aromatic polysulfones have excellent heat resistance. One typical example is given by the formula:

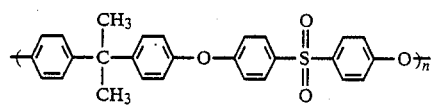

The all aromatic polyesters are polyesters having an aromatic backbone, one exemplary polymer having the structure:

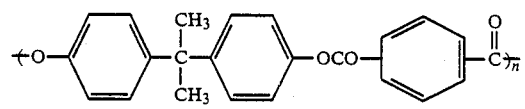

The polyether ether ketones (PEEK) have the structure:

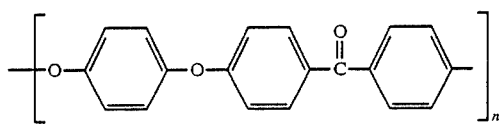

The polyether sulfones have the structure:

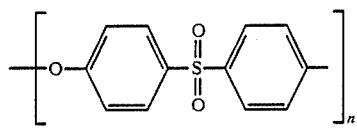

The polyether imides have the structure:

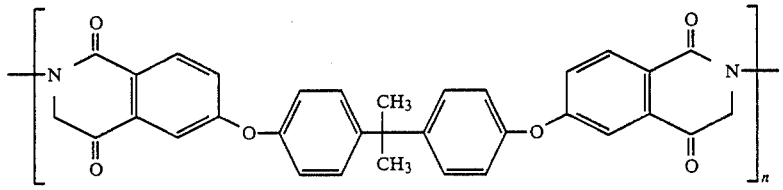

The shape, size, and thickness of the substrates of such heat resistant resins are not particularly limited as long as they meet the intended application. For example, they may take the form of film and disc.

According to the present invention, the substrate is plasma treated on at least one surface which is to bear a magnetic layer. The principle and operation of plasma treatment are as described above.

According to the present invention, the treating atmosphere used in the plasma treatment is an inorganic gas containing oxygen (O), an inorganic gas containing nitrogen (N) and hydrogen (H), or an inorganic gas containing nitrogen (N), hydrogen (H), and oxygen (O).

The inorganic gas may be suitably selected from $N_2$, $H_2$, $NH_3$, $O_2$, $O_3$, $H_2O$, and $NO_x$ including NO, $N_2O$, and $NO_2$, and mixtures thereof. When the inorganic gas contains oxygen, its oxygen content is preferably 5% by volume or higher. When the inorganic gas contains N, H, and optionally O, it preferably has an N content of 5 to 80 at%, and H content of 5 to 80 at%, and an O content of 0 to 50 at%. Outside this range the present invention is less effective.

In addition to the N—, H— and O-bearing gases mentioned above, the inorganic gas used may contain another gas which is selected from Ar, Ne, He and other rare gases and mixtures of two or more.

The thus plasma-treated heat-resistant resin substrate exhibits a substantially reduced contact angle and it is observed by FTIR (Fourier transform infrared absorption spectrum) that the surface has been modified and N—H and COOH linkages are formed.

On the plasma-treated surface of a substrate of heat resistant resin, a magnetic layer preferably of the metal thin film type is formed by any well-known techniques such as vacuum deposition and sputtering. Since the plasma-treated surface portion of resin substrate is free of or substantially free of water and thus sufficiently stable, crystal grains are grown with consistent orientation during formation of such a perpendicular magnetizable metal thin film. Due to the controlled crystal structure disturbance, there is obtained an improved magnetic recording medium having a perpendicular magnetizable film possessing a high coercive force in a direction perpendicular to the film surface.

Although a variety of metal thin films may be applied, those metal thin films of perpendicular magnetization type are most preferred. The effect of preventing disturbance of the crystal structure of a metal thin film during formation becomes most significant when the metal thin film is of perpendicular magnetization type.

The perpendicular magnetizable metal thin films may be selected from a variety of metal compositions including CoCr, CoV, CoNiP, CoP, MnBi, MnAlGe, NdFe, NdCo, CoO, MnSb, MnCuBi, GdFe, GdCo, PtCo, TbCo, TbFeCo, GdFeCo, $TbFeO_3$, GdIG, GdTbFe, GdTbFeCoBi, $CoFe_2O_4$, etc.

The magnetic layer may be formed on the plasma treated surface of a heat-resistant resin substrate directly or via an undercoat which may be formed by depositing an alloy of aluminum, copper, titanium, chromium or the like by ion plating, vacuum deposition, sputtering and other metallizing techniques.

Since a heat resistant resin having a heat distortion temperature of at least 150° C. is used as a substrate and such a resin substrate is plasma treated, the second aspect of the present invention enables formation of a magnetic layer having less or little distorted crystal structure due to the controlled release of water from the substrate surface during the process. Particularly when a perpendicular magnetizable metal thin film is formed, it displays a significantly high coercive force in a direction perpendicular to the film surface because of regular crystal structure. A significant improvement in durability is also accompanied.

EXAMPLES

Examples of the present invention are presented below together with comparative examples and experiments. These examples are to be construed as illustrating the present invention and not limiting the present invention.

EXAMPLE 1

Polyethylene terephthalate base films of 10 μm thick were plasma treated using a treating atmosphere of different gas mixtures as show below under Treatments T1–T6 and Comparative Treatments CT1–CT6.

Treatment 1

Treating gas: gas mixture of 10/1 $NH_3$/Ar
Gas flow rate: 50 ml/min.
Vacuum: 0.1 Torr
Power frequency: 100 kHz
Base film transfer rate: 30 m/min.

Treatment 2

Treating gas: $NH_3$
Gas flow rate: 100 ml/min.
Vacuum: 0.1 Torr

Power frequency: 100 kHz
Base film transfer rate: 30 m/min.

Treatment 3

Treating gas: gas mixture of 3/1 $NO_2/H_2$
Gas flow rate: 100 ml/min.
Vacuum: 0.1 Torr
Power frequency: 150 kHz
Base film transfer rate: 30 m/min.

Treatment 4

Treating gas: gas mixture of 5/1 $NH_3/O_2$
Gas flow rate: 50 ml/min.
Vacuum: 0.01 Torr
Power frequency: 50 kHz
Base film transfer rate: 30 m/min.

Treatment 5

The conditions used were the same as those of Treatment 1 except that the power frequency was 13.56 MHz which is a typical radio frequency.

Treatment 6

The conditions used were the same as those of Treatment 1 except that the power frequency was 500 kHz.

Comparative Treatment 1

A corona discharge treatment was carried out instead of the plasma treatment using a corona discharge machine P-500VA (manufactured by Pyra Co.) operating at a voltage of 200 volts while the base film was transferred at a speed of 30 m/minute.

Comparative Treatment 2

The conditions used were the same as those of Treatment 1 except that the treating gas was Ar.

Comparative Treatment 3

The conditions used were the same as those of Treatment 5 except that the treating gas was Ar.

Comparative Treatment 4

The conditions used were the same as those of Treatment 6 except that the treating gas was Ar.

Different magnetic laers ML1–ML3 were formed on the thus treated polyester films by the following methods, obtaining various magnetic tape samples as shown in Table 1.

Magnetic Layer 1

| Ingredients | Parts by weight |
| --- | --- |
| Fe—Co alloy powder | 100 |
| Abrasive ($Al_2O_3$) | 3 |
| Nitrocellulose | 6 |
| Epoxy resin (Epikote ® 1004) | 4 |
| Polyurethane (Nippolan ® 5033) | 10 |
| Solvent | 250 |

The mixture was milled for dispersion for 5 hours in a sand mill, to which 4 parts by weight of an isocyanate (Colonate L) was added. The composition was applied onto the base films by a conventional coating technique while magnetic orientation was effected.

Magnetic Layer 2

A magnetic layer of 0.1 μm thick was sputtered from a Co-Ni alloy of 95 wt% Co-5 wt% Ni.

Magnetic Layer 3

A magnetic layer of 0.1 μm thick was deposited from a Co-Ni ingot of 80wt% Co-20 wt% Ni alloy in an oxygen-containing atmosphere by the oblique incidence evaporation technique.

The treated base films and the final magnetic recording tapes were examined for bond strength, still life, and contact angle by the following tests.

A. Bond strength

An adhesive tape was attached to the magnetic layer of each magnetic recording tape sample having a width of ¼ inch under a predetermined pressure. The adhesive tape was then pulled in a direction at an angle of 180° with respect to the original surface at a given rate. The force required to peel off the adhesive tape was measured.

B. Still life

A commercially available VTR equipment was loaded with a tape and operated in a still mode to continuously reproduce a still image until the still image disappeared. Still life is a period of time during which the still image was being reproduced.

C. Contact angle

The contact angle of the plasma-treated surface of the base films was determined by the water drop projection method using a contact angle meter of CA-P type (manufactured by Kyowa Chemical K.K., Japan).

The results are shown in Table 1.

The data in Table 1 demonstrate the benefits of the present invention. The base film samples treated according to the present invention were analyzed by FTIR to find that N—H linkages are present on the surface.

TABLE 1

| Sample No. | Magnetic recording medium | | Bond strength (g) | Still life (min.) | Contact angle (°) |
| --- | --- | --- | --- | --- | --- |
| | Base film treatment | Magnetic layer | | | |
| 1 | T1 | ML1 | 55 | >240 | 32 |
| 2 | T1 | ML2 | — | 120 | 32 |
| 3 | T1 | ML3 | — | 110 | 32 |
| 4 | T2 | ML1 | 60 | >240 | 30 |
| 5 | T3 | ML1 | 65 | >240 | 15 |
| 6 | T4 | ML1 | 70 | >240 | 18 |
| 7* | T5 | ML1 | 35 | 100 | 51 |
| 8* | T6 | ML1 | 40 | 130 | 42 |
| 9* | CT1 | ML1 | 20 | 65 | 55 |
| 10* | CT1 | ML2 | — | 60 | 55 |
| 11* | CT1 | ML3 | — | 40 | 55 |
| 12* | CT2 | ML1 | 25 | 70 | 54 |
| 13* | CT2 | ML2 | — | 80 | 54 |
| 14* | CT2 | ML3 | — | 40 | 54 |
| 15* | CT3 | ML1 | 25 | 80 | 50 |
| 16* | CT3 | ML2 | — | 85 | 50 |
| 17* | CT3 | ML3 | — | 45 | 50 |
| 18* | CT4 | ML1 | 30 | 80 | 48 |
| 19* | CT4 | ML2 | — | 85 | 48 |
| 20* | CT4 | ML3 | — | 40 | 48 |

*comparative examples

EXAMPLE 2

Substrates of different resinous materials designated below as S1–S3 were plasma treated using a treating atmosphere of different gas mixtures as shown below under Treatments T1–T7 and Comparative Treatments CT1–CT4.

Substrate Material S1

Aromatic polyamide (Aramide Film, trade name of Toray K.K., Japan)

Substrate Material S2

Aromatic polyimide (Capton, trade mark of E. I. DuPont de Nemours Co.)

Substrate Material S3

Polyphenylene sulfide (Liton, trade mark of Phillips Ptroleum Co.)

Treatment 1

Treating gas: gas mixture of 1/1 $O_2/Ar$
Gas flow rate: 50 ml/min.
Vacuum: 0.1 Torr
Power frequency: 100 kHz

Treatment 2

Treating gas: $NH_3$
Gas flow rate: 100 ml/min.
Vacuum: 0.1 Torr
Power frequency: 100 kHz

Treatment 3

Treating gs: gas mixture of 3/1 $NO_2/H_2$
Gas flow rate: 100 ml/min.
Vacuum: 0.1 Torr
Power frequency: 150 kHz

Treatment 4

The conditions used were the same as those of Treatment 1 except that an AC power source was used.

Treatment 5

The conditions used were the same as those of Treatment 1 except that the power frequency was 500 kHz.

Treatment 6

The conditions used were the same as those of Treatment 2 except that a DC power source was used.

Treatment 7

The conditions used were the same as those of Treatment 2 except that the power frequency was 13.56 MHz which is a typical radio frequency.

Comparative Treatment 1

A corona discharge treatment was carried out instead of the plasma treatment using a corona discharge machine P-500VA (manufactured by Pyra Co.) operating at a voltage of 200 volts.

Comparative Treatment 2

The conditions used were the same as those of Treatment 1 except that the treating gas was Ar.

Comparative Treatment 3

The conditions used were the same as those of Treatment 4 except that the treating gas was Ar.

Comparative Treatment 4

The conditions used were the same as those of Treatment 5 except that the treating gas was Ar.

Different magnetic layers ML1–ML2 were formed on the thus treated substrates by the following methods, obtaining various 5″ magnetic discs as shown in Table 2.

Magnetic Layer 1

A magnetic layer of 0.1 μm thick was deposited from a Co-Cr alloy ingot by effectively utilizing a perpendicular incident component of evaporated atoms. The deposition was controlled such that the magnetic layer had a composition of 80wt% Co and 20wt% Cr

Magnetic Layer 2

A magnetic layer of 0.1 μm thick was sputtered from a Co-Cr ingot of 80wt% Co-20 wt% Cr composition.

The treated substrates and the final magnetic recording discs were examined by the following tests, respectively.

A. Endurance time

A 5″ magnetic disc was recorded by means of a perpendicular magnetic hea and then operated in reproduction mode. The endurance time is a time of operation continued until the reproduced output was reduced to 95% of the initial output.

B. Contact angle

The contact angle of the plasma-treated surface of the substrates was determined by the water drop projection method using a contact angle meter of CA-P type (manufactured by Kyowa Chemical K.K., Japan).

C. $\Delta\theta_{50}$

A crystal structure X-ray analyzer was used. For the purpose of examining the dispersion of Co about C axis, a half-width value $\Delta\theta_{50}$ was determined from the locking curve obtained along (002) plane.

The results are shown in Table 2.

The data in Table 2 demonstrate the benefits of the present invention.

TABLE 2

| Sample No. | Magnetic recording medium | | | Endurance time (hr.) | Contact angle (°) | $\Delta\theta_{50}$ |
|---|---|---|---|---|---|---|
| | Substrate | Surface treatment | Magnetic layer | | | |
| 101 | S1 | T1 | ML1 | >120 | 20 | 5 |
| 102 | S1 | T1 | ML2 | >120 | 20 | 3 |
| 103 | S1 | T2 | ML1 | >120 | 31 | 5 |
| 104 | S1 | T3 | ML1 | >120 | 25 | 4 |
| 105 | S1 | T4 | ML1 | 55 | 48 | 11 |
| 106 | S1 | T5 | ML1 | 60 | 45 | 10 |
| 107 | S1 | T6 | ML1 | 50 | 40 | 10 |
| 108 | S1 | T7 | ML1 | 50 | 41 | 9 |
| 109 | S1 | CT1 | ML1 | 40 | 62 | 13 |
| 110 | S1 | CT2 | ML1 | 50 | 50 | 12 |
| 111 | S1 | CT3 | ML1 | 55 | 52 | 12 |
| 112 | S1 | — | ML1 | 40 | 70 | 16 |
| 113 | S2 | T1 | ML2 | >120 | 18 | 3 |
| 114 | S2 | T2 | ML2 | >120 | 29 | 3 |
| 115 | S2 | T3 | ML2 | >120 | 25 | 4 |
| 116 | S2 | T4 | ML2 | 85 | 52 | 8 |
| 117 | S2 | T5 | ML2 | 80 | 48 | 8 |
| 118 | S2 | T6 | ML2 | 75 | 50 | 9 |
| 119 | S2 | — | ML2 | 60 | 68 | 12 |
| 120 | S2 | CT1 | ML2 | 65 | 60 | 11 |
| 121 | S2 | CT4 | ML2 | 70 | 55 | 11 |
| 122 | S3 | T1 | ML1 | >120 | 28 | 5 |
| 123 | S3 | T2 | ML1 | >120 | 35 | 6 |
| 124 | S3 | CT1 | ML1 | 45 | 60 | 12 |
| 125 | S3 | CT3 | ML1 | 60 | 50 | 10 |

We claim:
1. A magnetic recording medium comprising:
a base film which has been plasma treated at a frequency of 10 kHz to 200 kHz in an atmosphere consisting essentially of an inorganic gas containing N and H, and;

a magnetic layer formed on said base film.

2. A magnetic recording medium according to claim 1 which further comprises an undercoat layer interposed between the base film and the magnetic layer.

3. A magnetic recording medium comprising:

a base film which has been plasma treated at a frequency of 10 kHz to 200 kHz in an atmosphere consisting essentially of an inorganic gas containing N, H and O, and;

a magnetic layer formed on said base film.

4. A magnetic recording medium according to claim 3 which further comprises an undercoat layer interposed between the base film and the magnetic layer.

5. A magnetic recording medium comprising:

a substrate formed of a resin having a heat distortion temperature of at least 150° C. which has been plasma treated at a frequency of 10 kHz to 200 kHz in an atmosphere consisting essentially of an inorganic gas containing N, H or O, or mixtures thereof, and;

a magnetic layer formed on said substrate.

6. A magnetic recording medium according to claim 5 which further comprises an undercoat layer interposed between the base film and the magnetic layer.

7. A magnetic recording medium according to claim 5 wherein the rsin of which the substrate is formed is one member selected from the group consisting of a polyamide, polyimide, polyphenylene sulfide, polysulfone, all aromatic polyester, polyether ether ketone, polyether sulfone and polyetherimide, and mixtures thereof.

8. A magnetic recording medium according to claim 5 wherein the magnetic layer is a metallic thin film.

9. A magnetic recording medium according to claim 5 wherein the inorganic gas contains oxygen.

10. A magnetic recording medium according to claim 5 wherein the inorganic gas contains N and H.

11. A magnetic recording medium according to claim 5 wherein the inorganic gas contains N, H and O.

* * * * *

UNITED STATES PATENT AND TRADEMARK OFFICE
CERTIFICATE OF CORRECTION

PATENT NO. : 4,816,341

DATED : March 28, 1989

INVENTOR(S) : NAKAYAMA ET AL

It is certified that error appears in the above-identified patent and that said Letters Patent is hereby corrected as shown below:

Claim 5, line 3, delete "C." and insert --C--.

Claim 7, line 2, delete "rsin" and insert --resin--.

Signed and Sealed this

Twenty-seventh Day of February, 1990

*Attest:*

JEFFREY M. SAMUELS

*Attesting Officer*  *Acting Commissioner of Patents and Trademarks*